(12) United States Patent
Cazzaniga (10) Patent No.: US 7,796,437 B2
(45) Date of Patent: Sep. 14, 2010

(54) VOLTAGE REGULATOR WITH REDUCED SENSITIVITY OF OUTPUT VOLTAGE TO CHANGE IN LOAD CURRENT

(75) Inventor: Marco Cazzaniga, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 137 days.

(21) Appl. No.: 12/236,382

(22) Filed: Sep. 23, 2008

(65) Prior Publication Data
US 2010/0074034 A1 Mar. 25, 2010

(51) Int. Cl.
G11C 16/06 (2006.01)
(52) U.S. Cl. .................... 365/185.21; 365/185.18; 365/185.23
(58) Field of Classification Search ............ 365/185.21, 365/185.18, 185.23
See application file for complete search history.

(56) References Cited

U.S. PATENT DOCUMENTS

| | | | |
|---|---|---|---|
| 5,638,320 A * | 6/1997 | Wong et al. | 365/185.03 |
| 6,411,549 B1 * | 6/2002 | Pathak et al. | 365/185.2 |
| 6,472,855 B2 | 10/2002 | Ball | |
| 6,522,111 B2 | 2/2003 | Zadeh et al. | |
| 6,583,610 B2 | 6/2003 | Groom et al. | |
| 6,822,905 B2 * | 11/2004 | Micheloni et al. | 365/185.21 |
| 7,221,213 B2 | 5/2007 | Lee et al. | |

* cited by examiner

*Primary Examiner*—Huan Hoang
(74) *Attorney, Agent, or Firm*—Vierra Magen Marcus & DeNiro, LLP (57) ABSTRACT

A voltage regulator is disclosed. The voltage regulator has a voltage generation circuit that outputs a regulated voltage and a load current. The voltage regulation circuit has a sensing circuit that senses a peak magnitude of the load current and stores a peak signal that is based on the peak load current magnitude. The sensing circuit receives at least one signal that is input to the voltage regulation circuit and senses the peak magnitude of the load current. The voltage regulation circuit has a current generation circuit that generates a compensation current that has a magnitude that is proportional to the peak load current magnitude. The current generation circuit generates the compensation current based on the peak signal. The compensation current is provided during a time interval that is defined by at least one signal that is input to the voltage regulation circuit.

21 Claims, 10 Drawing Sheets

FIG. 10 too long interval in which the sense amplifiers sense conditions of the non-volatile storage elements.

One embodiment is a method that comprising the following. A regulated voltage is generated at an output node. The output node has a load current associated therewith. The regulated voltage is applied to non-volatile storage elements in a memory array. A peak magnitude of the load current is sensed in response to at least one signal that is derived from timing signals that are used when reading the non-volatile storage elements. A compensation current that is proportional to the peak magnitude of the load current is generated. A condition associated with at least a first non-volatile storage element of the non-volatile storage elements is determined. The compensation current is provided to the output node while determining the condition.

BRIEF DESCRIPTION OF THE DRAWINGS

FIGS. 6A-6F depict one embodiment of signals associated with the memory sense circuit of FIG. 5.

FIGS. 7A-7G depicts timing signals and the output voltage of a voltage regulator under changing load conditions.

FIGS. 9A-9G depicts timing signals used during the operation of the voltage regulator of FIG. 8.

DETAILED DESCRIPTION

Figure 1:
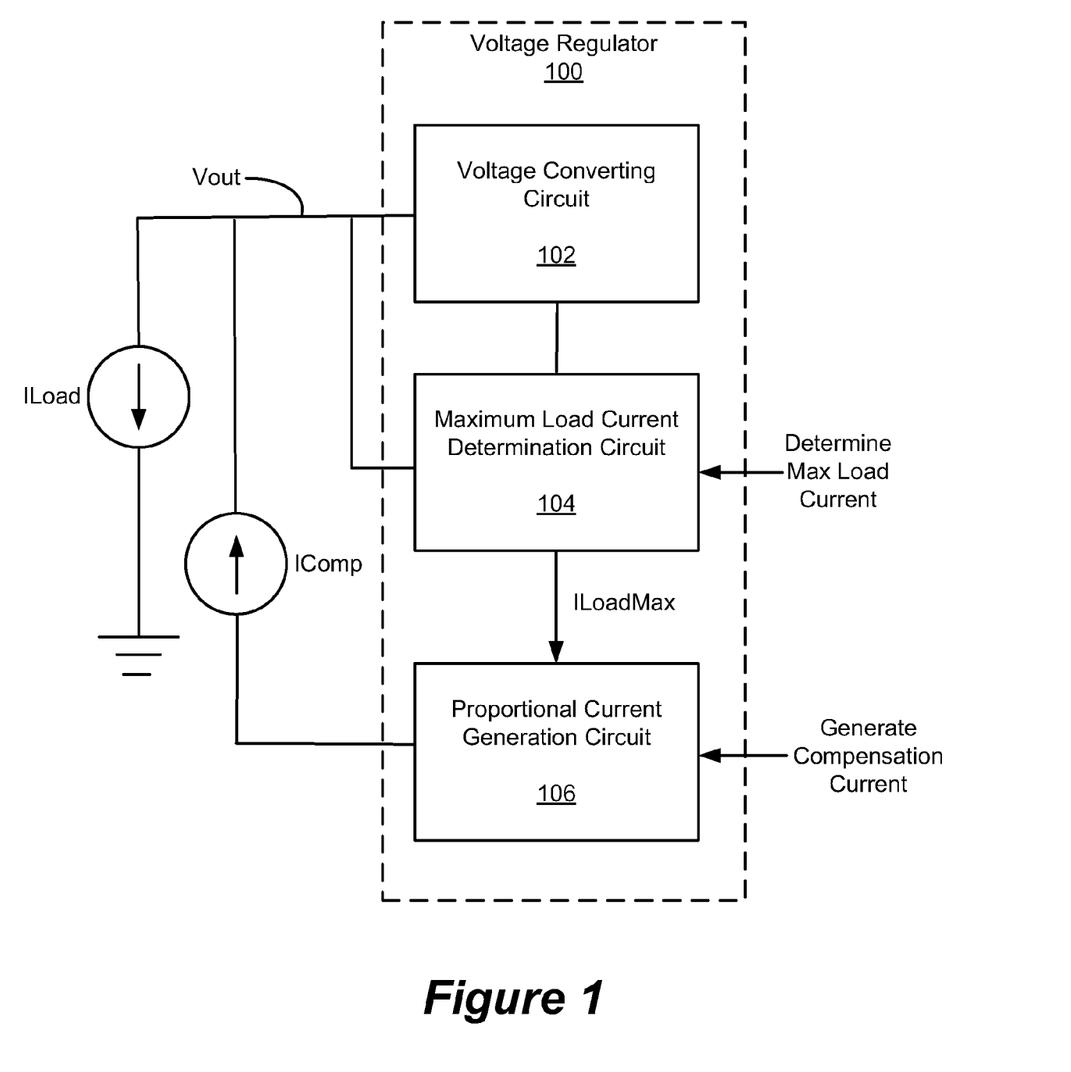
FIG. 1 is a block diagram of one embodiment of a voltage regulator.

FIG. 1 depicts a block diagram of one embodiment of a voltage regulator 100. In general, the voltage regulator 100 includes a voltage converting circuit 102, a maximum load current determination circuit 104, and a proportional current generation circuit 106. In some embodiments, the voltage regulator 100 is used in a non-volatile storage device. Specifically, the voltage regulator 100 may be used to provide a regulated voltage to memory elements during a read (or sense) operation.

The voltage converting circuit 102 provides a regulated voltage "$V_{OUT}$" to a load (e.g., memory element). The voltage converting circuit 102 provides a load current "$I_{LOAD}$" that depends on the characteristics (e.g., impedance) of the load. Thus, if the impedance of the load changes, the load current will change. For example, if a switch closes to connect the voltage regulator 100 to memory elements to charge them to a known voltage prior to reading the memory elements, the load abruptly changes. The voltage regulator 100 attempts to keep the output voltage at a target voltage. However, abrupt changes to the load current can cause $V_{OUT}$ to deviate from the target voltage for a period of time. Specifically, $V_{OUT}$ may oscillate above and below the target voltage in a ripple that decays over time.

The maximum load current determination circuit 104 determines the maximum load current "$I_{LOADMAX}$". In this implementation, the maximum load current determination circuit 104 inputs a signal that defines the interval during which the maximum load current should be determined. As an example, the maximum load current when charging the memory elements could be determined.

The proportional current generation circuit 106 generates a compensation current "$I_{COMP}$" that is proportional to the maximum load current $I_{LOADMAX}$. The compensation current is provided to the output of the voltage regulator 100. The purpose of the compensation current is to help to stabilize $V_{OUT}$ after an abrupt change to the load current $I_{LOAD}$. For example, after an abrupt change to the load current causes the output voltage to deviate from the target voltage, the compensation current $I_{COMP}$ helps the voltage regulator 100 stabilize $V_{OUT}$ back to the target level.

The proportional current generation circuit 106 inputs a signal that defines an interval during which the compensation current $I_{COMP}$ is to be provided to the output. Note that there may be a gap in time between sensing the maximum load current $I_{LOADMAX}$ and providing the compensation current $I_{COMP}$. Also note that the compensation current $I_{COMP}$ may be significantly smaller in absolute magnitude than the maximum load current $I_{LOADMAX}$.

As previously mentioned, the voltage regulator 100 may be used in a non-volatile storage device. The following is an example of memory elements that may be used in a non-volatile storage device and an example architecture for a non-volatile storage device.

Figure 2:
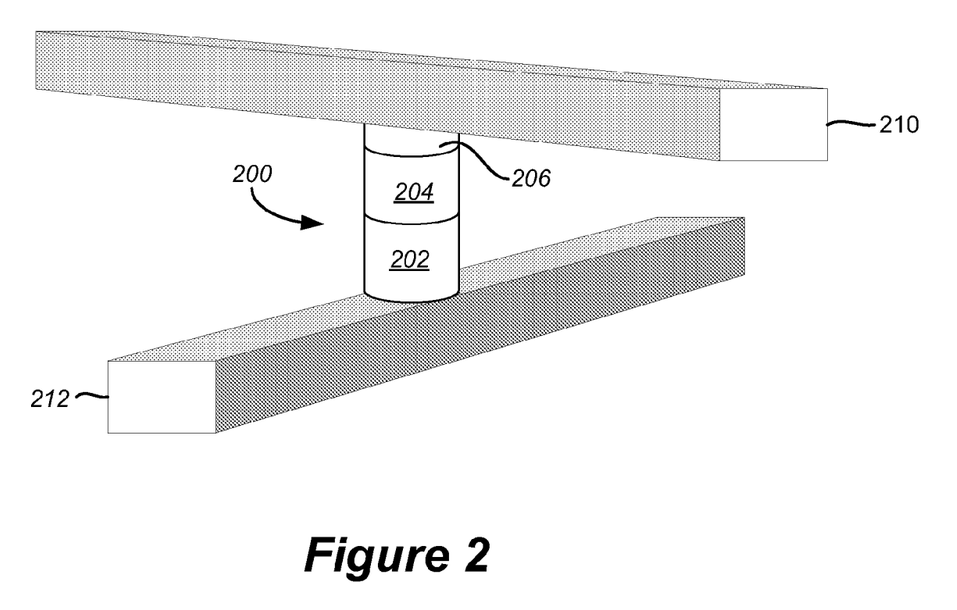
FIG. 2 depicts an exemplary non-volatile memory element in accordance with one embodiment.

FIG. 2 depicts an exemplary structure for a non-volatile memory element that can be used in accordance with embodiments of the present disclosure. A two-terminal memory element 200 as depicted in FIG. 2 includes a first terminal portion connected to a first conductor 210 and a second terminal portion connected to a second conductor 212. The memory element 200 includes a steering element 202 in series with a state change element 204 and an anti-fuse 206 to provide non-volatile data storage. The steering element can take the form of any suitable device exhibiting a nonlinear conduction current characteristic such as a simple diode. The state change element 204 will vary by embodiment and can include numerous types of materials to store data through representative physical states. State change element 204 can include resistance change materials, phase change resistive materials, etc. For example, a semiconductor or other material having at least two levels of detectable resistance change (e.g., low to high and high to low) is used in one embodiment to form a passive storage element 200.

Examples of suitable materials for state change element 204 include, but are not limited to doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. The resistivity of these materials in some cases may only be switched in a first direction (e.g., high to low), while in others, the resistivity may be switched from a first level (e.g., higher resistance) to a second level (e.g., lower resistance), and then switched back toward the first resistivity level.

In one embodiment, the state change element 204 is $Ge_2Sb_2Te_5$ (GST). GST has a property of reversible phase change from crystalline to amorphous-allowing two levels per cell. However, quasi-amorphous and quasi-crystalline phases may also be used to allow additional levels per cell with GST.

In some embodiments, the state change element 204 is formed from a carbon material. A state change element 204 that is formed from carbon may comprise any combination of amorphous and graphitic carbon. In one aspect, the carbon is deposited as a carbon film. However, it is not required that a carbon state change element be a carbon film. In one aspect, the state change element 204 is a carbon nanotube (CNT).

By assigning logical data values to the various levels of resistance that can be set and read from resistance change element 204, memory element 200 can provide reliable data read/write capabilities. Anti-fuse 206 can further provide resistance state change abilities that can be exploited for non-volatile data storage. An anti-fuse is manufactured in a high resistance state and can be popped or fused to a lower resistance state. An anti-fuse is typically non-conductive in its initial state and exhibits high conductivity with low resistance in its popped or fused state. As a discreet device or element may have a resistance and different resistance states, the terms resistivity and resistivity state are used to refer to the properties of materials themselves. Thus, while a resistance change element or device may have resistance states, a resistivity change material may have resistivity states.

Anti-fuse 206 can provide benefits to memory element 200 beyond its state change ability. For example, an anti-fuse can serve to set the on-resistance of the memory element in at an appropriate level relative to the read-write circuitry associated with the cell. These circuits are typically used to pop the anti-fuse and have an associated resistance. Because these circuits drive the voltages and current levels to pop the anti-fuse, the anti-fuse tends to set the memory element in an appropriate on-resistance state for these same circuits during later operations.

A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset). Embodiments in accordance with the present disclosure can be used to set memory elements to a lower resistance state or to reset memory elements to a higher resistance state. While specific examples may be provided with respect to set or reset operations, it will be appreciated that these are mere examples and that the disclosure is not so limited.

Various types of suitable state change elements are described in U.S. Pat. No. 6,034,882 entitled "Vertically Stacked Field Programmable Non-volatile Memory and Method of Fabrication." Various other types of state change elements may be used, including those described in U.S. Pat. No. 6,420,215 entitled "Three Dimensional Memory Array and Method of fabrication," and U.S. Pat. No. 6,631,085, entitled "Three-Dimensional Memory Array Incorporating Serial Chain Diode Stack," all hereby incorporated by reference in their entirety.

It will be appreciated that other types of two-terminal non-volatile memory elements can be used in embodiments. For example, one embodiment does not have an anti-fuse 206 and merely includes state change element 204 and steering element 202. Other embodiments may include additional state change elements in place of or in addition to the anti-fuse.

Conductors 210 and 212 are typically orthogonal to one another and form array terminal lines for accessing an array of memory elements 200. The array terminal lines (also called array lines) at one layer may be termed word lines or X-lines. The array lines at a vertically adjacent layer may be termed bit lines or Y-lines. A memory element can be formed at the projected intersection of each word line and each bit line, and connected between the respective intersecting word line and bit line as shown for the formation of memory element 200. A three-dimensional memory array which has at least two levels of memory elements (i.e., two memory planes) may utilize more than one layer of word lines and/or more than one layer of bit lines. A monolithic three dimensional memory array is one in which multiple memory levels are formed above a single substrate, such as a wafer, with no intervening substrates.

Figure 3A:
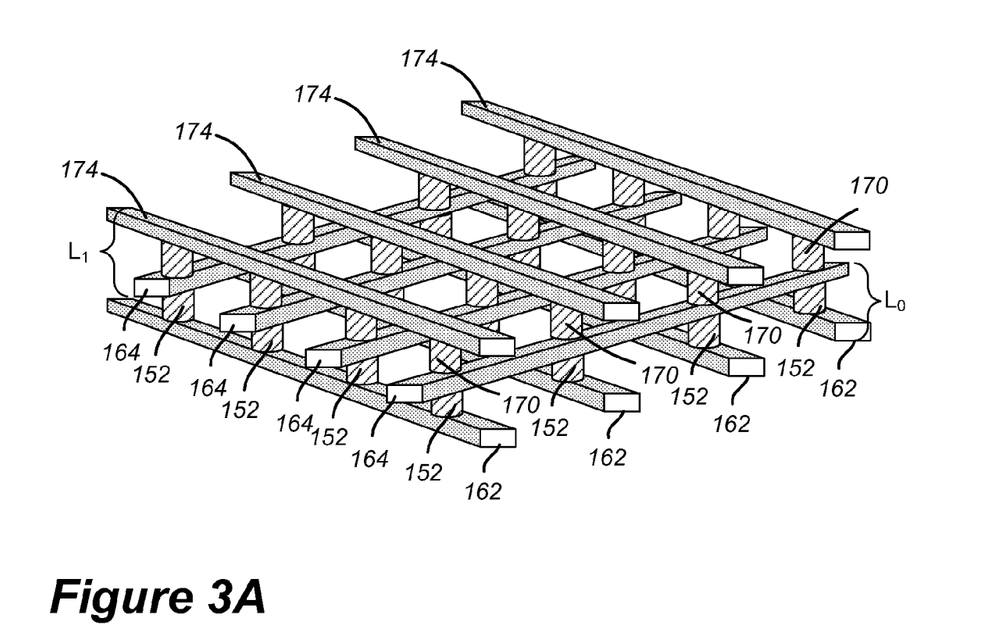
FIGS. 3A and 3B are respective perspective and cross-sectional views of a three-dimensional memory array in accordance with one embodiment.
Figure 3B:
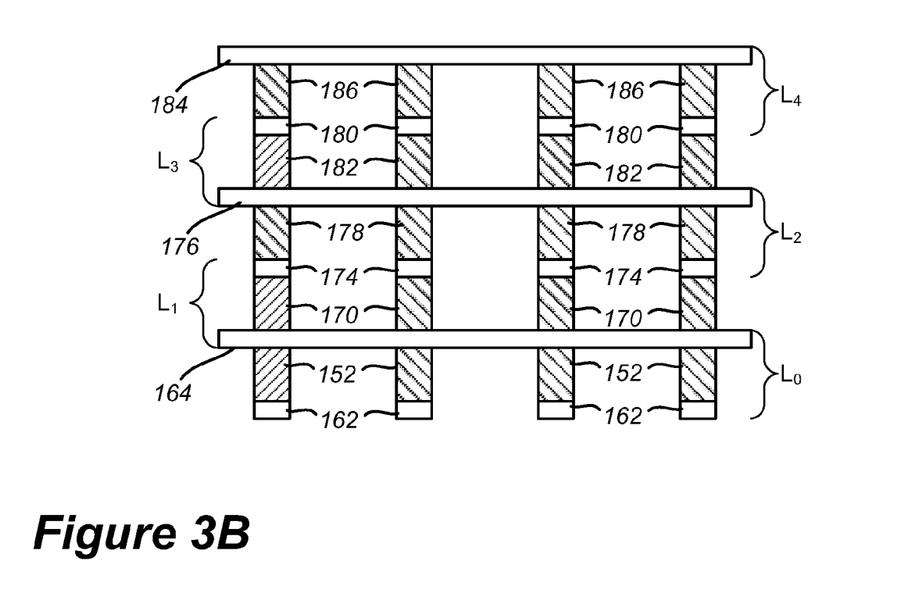

FIGS. 3A-3B depict a portion of an exemplary monolithic three-dimensional memory array that can be used in various embodiments. However, other memory structures can be used in accordance with various embodiments, including two-dimensional memory structures manufactured on, above, or within a semiconductor substrate. Both the word line and bit line layers are shared between memory elements in the structure depicted in the perspective view of FIG. 3A. This configuration is often referred to as a fully mirrored structure. A plurality of substantially parallel and coplanar conductors form a first set of bit lines 162 at a first memory level L0. Memory elements 152 at level L0 are formed between these bit lines and adjacent word lines 164. In the arrangement of FIGS. 3A-3B, word lines 164 are shared between memory layers L0 and L1 and thus, further connect to memory elements 170 at memory level L1. A third set of conductors form the bit lines 174 for these cells at level L1. These bit lines 174 are in turn shared between memory levels L1 and memory level L2, depicted in the cross-sectional view of FIG. 3B. Memory elements 178 are connected to bit lines 174 and word lines 176 to form the third memory level L2, memory elements 182 are connected to word lines 176 and bit lines 180 to form the fourth memory level L3, and memory elements 186 are connected to bit lines 180 and word lines 184 to form the fifth memory level L5. The arrangement of the diodes' polarity and the respective arrangement of the word lines and bit lines can vary by embodiment. Additionally, more or fewer than five memory levels can be used.

In an alternative embodiment, an inter-level dielectric can be formed between adjacent memory levels. In this alternative, no conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the word lines or only the bit lines are shared in some configurations. A first memory level L0 can include memory elements between a bit line level BL0 and word line level WL0. The word lines at level WL0 can be shared to form cells at a memory level L1 that connect to a second bit line level BL1. The bit line layers are not shared so the next layer can include an interlayer dielectric to separate bit lines BL1 from the next level of conductors. This type of configuration is often referred to as half-mirrored. Memory levels need not all be formed having the same type of memory element. If desired, memory levels using resistive change materials can alternate with memory levels using other types of memory elements, etc.

In one embodiment, word lines are formed using word line segments disposed on different word line layers of the array. The segments can be connected by a vertical connection to form an individual word line. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address. An example of such a configuration is described in U.S. Pat. No. 7,054,219, entitled, "Transistor Layout Configuration for Tight Pitched Memory Array Lines, which is hereby incorporated by reference in its entirety.

Figure 4:
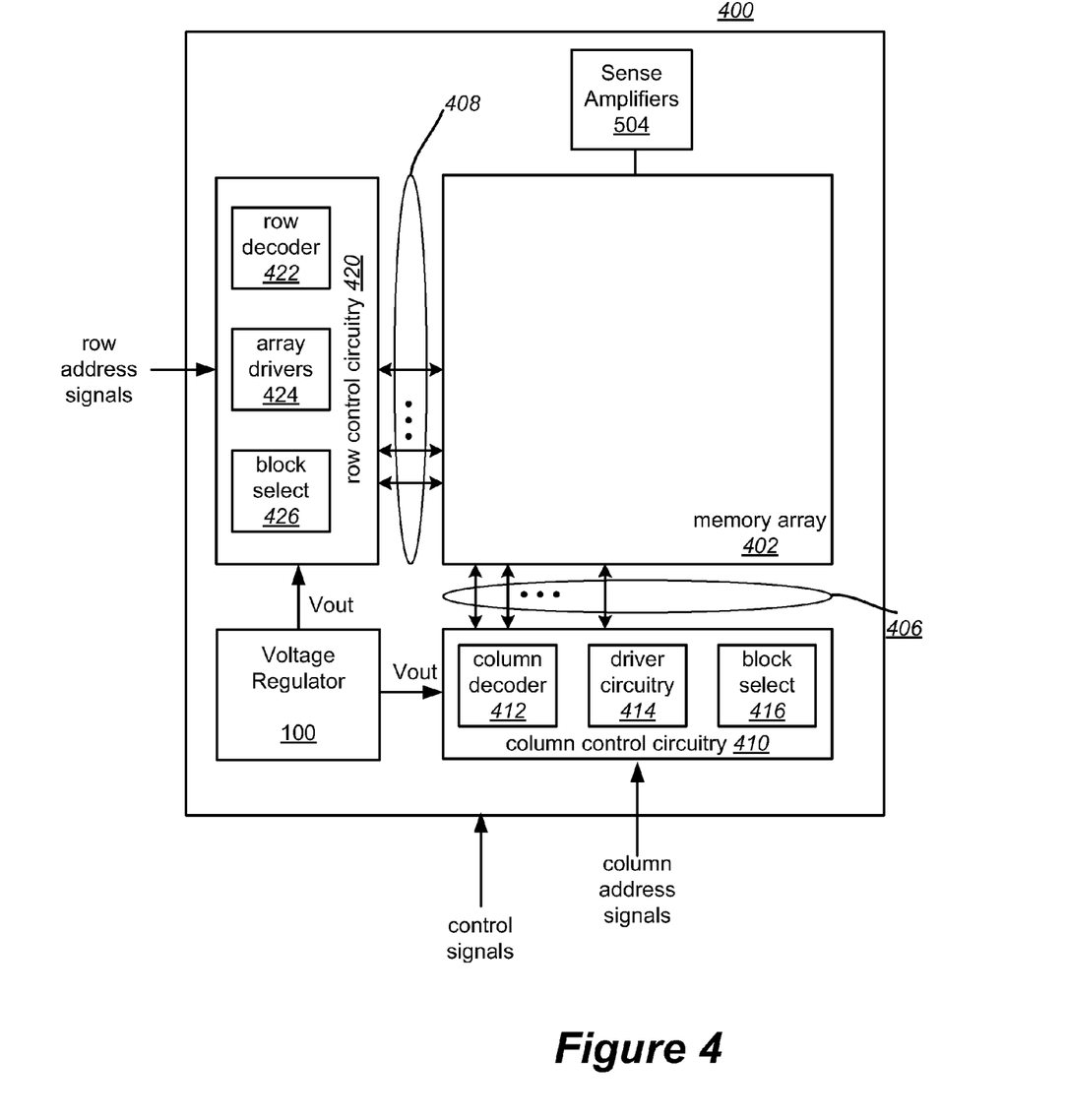
FIG. 4 is block diagram of a non-volatile memory system in accordance with one embodiment.

FIG. 4 is a block diagram of an integrated circuit including a memory array 402. The array terminal lines of memory array 402 include the various layer(s) of word lines organized as rows, and the various layer(s) of bit lines organized as columns. The integrated circuit 400 includes row control circuitry 420 whose outputs 408 are connected to respective word lines of the memory array 402. The row control circuitry receives a group of M row address signals and one or more various control signals, and typically may include such circuits as row decoders 422, array terminal drivers 424, and block select circuitry 426 for both read and write (i.e., programming) operations. The integrated circuit 400 also includes column control circuitry 410 whose input/outputs 406 are connected to respective bit lines of the memory array 402. The column control circuitry 406 receives a group of N column address signals and one or more various control signals, and typically may include such circuits as column decoders 412, array terminal receivers or drivers 414, block select circuitry 416, as well as read/write circuitry, and I/O multiplexers. Circuits such as the row control circuitry 420 and the column control circuitry 410 may be collectively termed control circuitry or array terminal circuits for their connection to the various array terminals of the memory array 402.

Voltage regulator 100 provides a regulated voltage $V_{OUT}$ to the row control circuit 420 and column control circuitry 410 for various operations such as reading memory elements. The sense amplifiers 504 are used to read the state in which memory elements are programmed.

Integrated circuits incorporating a memory array usually subdivide the array into a sometimes large number of subarrays or blocks. Blocks can be further grouped together into bays that contain, for example, 16, 32, or a different number of blocks. As frequently used, a sub-array is a contiguous group of memory elements having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory elements may dictate an upper limit to the number of memory elements which may be accessed simultaneously during a given memory cycle. Consequently, a large memory array is frequently subdivided into smaller sub-arrays to decrease the number of memory elements which are simultaneously accessed. Nonetheless, for ease of description, an array may also be used synonymously with sub-array to refer to a contiguous group of memory elements having contiguous word and bit lines generally unbroken by decoders, drivers, sense amplifiers, and input/output circuits. An integrated circuit may include one or more than one memory array.

Figure 5:
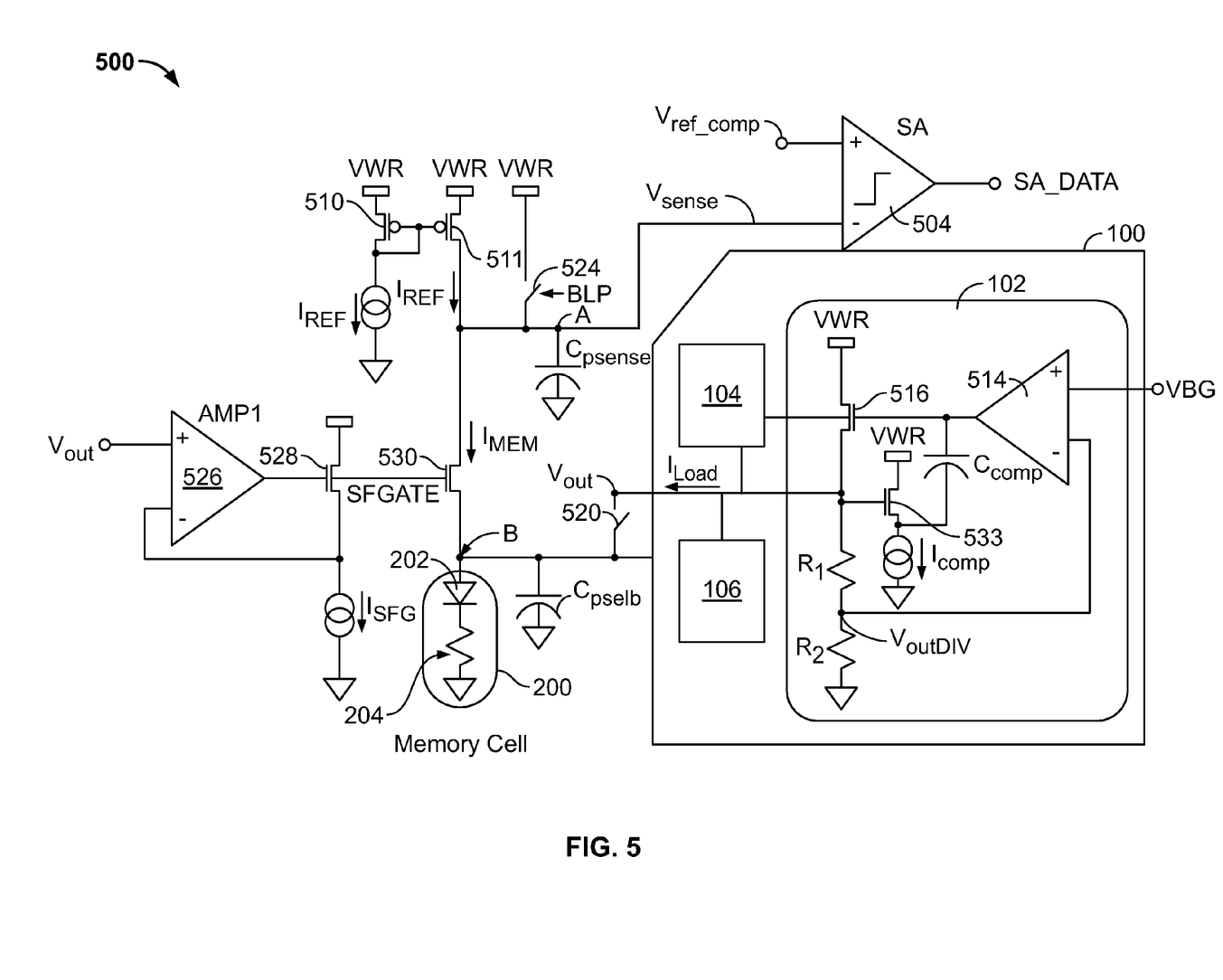
FIG. 5 depicts one embodiment of a memory sense circuit that is used to read the state of non-volatile storage elements.

FIG. 5 depicts one embodiment of a memory sense circuit 500 that is used to read the state of non-volatile storage elements. For each of depiction, the memory sense circuit depicts a single memory element 200, a single sense amplifier 504, and a voltage regulator 100. However, the voltage regulator 100 may be used to supply a regulated voltage to many (e.g., hundreds or thousands of memory elements).

In some embodiments, memory element operation is based on a bi-stable resistance change in the material that forms the state change element 204. The state change element 204 can be made to change state by the application of a high bias voltage (e.g., 4 V). Current through the memory element 200 is a function of the resistance of the state change element 204. The memory elements 200 are read at a lower voltage than the program voltage such that reading will not change the resistance of the state change element 204.

For example, if the memory element 200 has been programmed to state "1", the current "$I_{MEM}$" is measurably larger than if the memory element 200 has been programmed to state "0". In some implementations, $I_{MEM}$ may be an order of magnitude larger in one state than the other state. The state change element 204 is depicted as a resistor in FIG. 5. The state change element 204 has a steering element 202 coupled to it, which in this circuit is a diode.

The memory sense circuit 500 includes a voltage regulator 100 that supplies a voltage "$V_{OUT}$". Basic operation of the voltage regulator 100 is as follows. The voltage converting circuit 102 converts an input voltage "VWR" into an output voltage "$V_{OUT}$" and supplies an output current "$I_{LOAD}$" in accordance with requirements of a load. In this example, the load includes the memory element 200. The memory element 200 has a steering element 202 (e.g., a diode) and a resistive state change element 204. Note that it is not desirable to keep the memory element 200 charged to $V_{OUT}$ at all times. Rather, the memory element 200 is charged to $V_{OUT}$ just prior to reading the memory element 200.

A resistive voltage divider formed of series-connected resistors "R1" and "R2" in the voltage regulator 100 generates a feedback voltage "$V_{OUTDIV}$" representative of the output voltage $V_{OUT}$. By comparing the feedback voltage $V_{OUTDIV}$ and a predetermined reference voltage "VBG," amplifier 514 generates and applies an error voltage to a gate of output transistor 516. The drain of output transistor 516 is connected to the input voltage VWR and the source of output transistor 516 is connected to R1 at the node that provides the output voltage $V_{OUT}$. The voltage converting circuit 102 has a compensation capacitor $C_{COMP}$ with one plate connected to the output of the amplifier 514 and the other plate connected to the drain of transistor 533. Transistor 533 provides a compensation current $I_{COMP}$. This compensation current $I_{COMP}$ is part of the normal operation of the voltage converting circuit 102 and is not a part of generating a current that is proportional to the maximum load current $I_{LOADMAX}$.

The voltage regulator 100 also has a maximum load current determination circuit 104 and a proportional current generation circuit 106. In this embodiment, the maximum load current determination circuit 104 is connected to the output of amplifier 514 and the node that supplies $V_{OUT}$. The proportional current generation circuit 106 is connected to the node that supplies $V_{OUT}$ (and to the maximum load current determination circuit 104). Basic operation of these circuits 104, 106 has been discussed with respect to FIG. 1. Additional details of these circuits 104, 106 will be discussed below.

A sense amplifier (or comparator) 504 is used to determine the state to which the memory element 200 is programmed by comparing a voltage "$V_{SENSE}$" at node A with a reference voltage "$V_{REF\_COMP}$." Node A has a capacitance of "$C_{PSENSE}$," which may be a parasitic capacitance. Node A is a point on a conductive (e.g., metal) line with one end at the inverting input of the sense amplifier 504 and the other end at the drain of transistor 530. The parasitic capacitance may be due at least in part to capacitive coupling between this conductive line and other conductive lines. Prior to sensing the memory element 200, the voltage at node A is established at a known voltage. Then, the (parasitic) capacitance at node A is discharged based in part on a current from the memory element 200. More particularly, the current mirror formed by transistors 510, 511 produces a reference current "$I_{REF}$," which is fed into node A. Further, the memory element current "$I_{MEM}$" is drawn away from node A. Thus, the capacitor, $C_{PSENSE}$, is discharged at a rate that is based on the difference between currents $I_{REF}$ and Imem. The output (SA_DATA) of the sense amplifier 504 will flip if the voltage at node A is less than the reference voltage $V_{REF\_COMP}$. Thus, the output of the sense amplifier 504 is a signal that indicates the state in which the memory element 200 is programmed.

Figure 7:
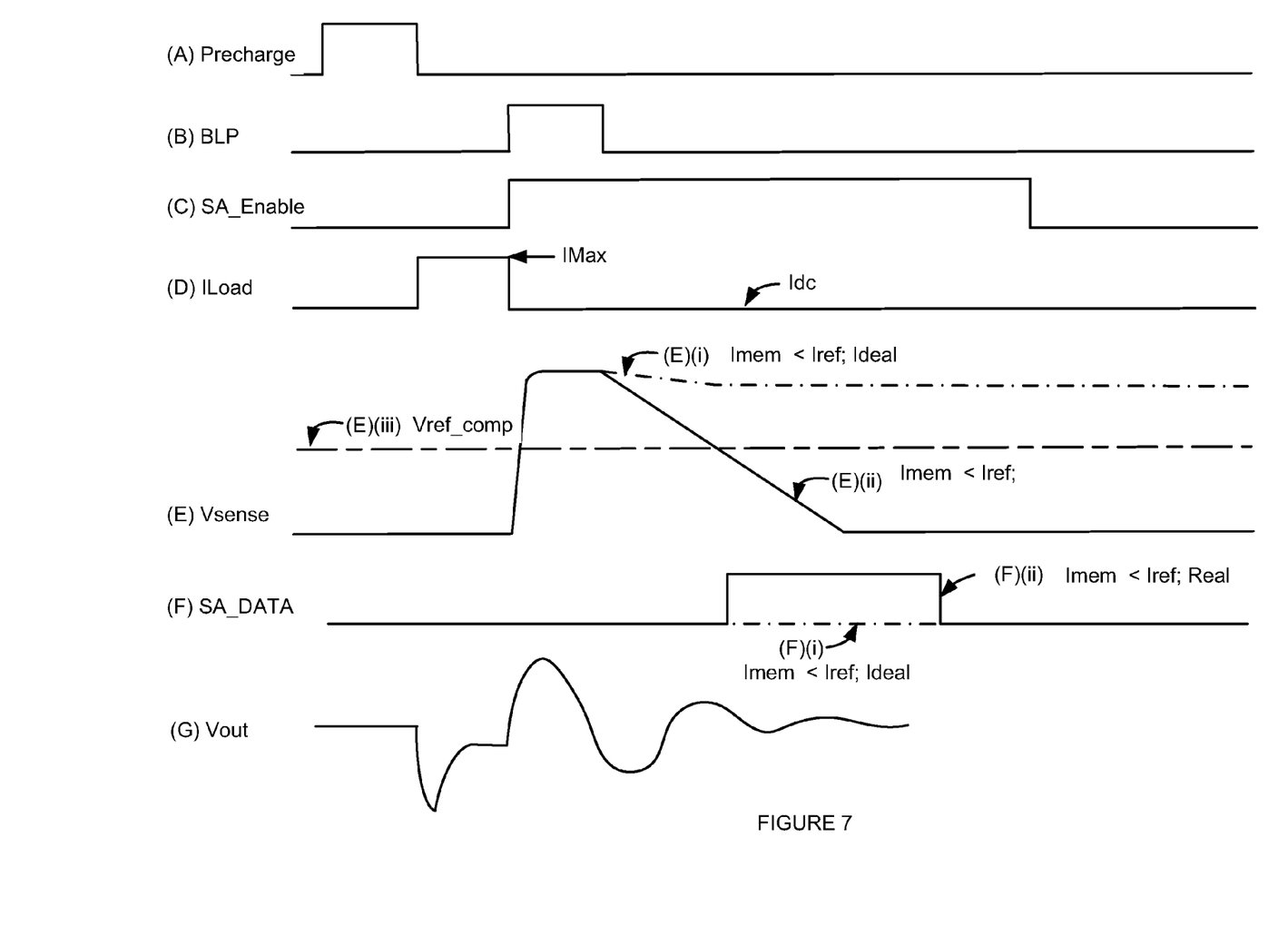

Prior to reading the state of a memory element 200 the voltage of the memory element 200 is raised to $V_{OUT}$. At other times, the memory element 200 may be kept at ground. Thus, prior to reading the memory element 200, the memory element 200 is connected to the voltage regulator 100, which causes an abrupt change to the voltage regulator load. In general, when the load on a linear voltage regulator makes a significant transition (e.g., from heavy loading to light loading or from light loading to heavy loading) the output voltage is disturbed. In the circuit 500, this disturb of the output voltage charges (or discharges) the parasitic capacitance "$C_{PSELB}$" at node B (the anode of the steering element 202 in the memory element 200). Typically, the voltage regulator output voltage $V_{OUT}$ overshoots in an attempt to re-establish the target voltage. More specifically, $V_{OUT}$ is typically a ripple that dies down over time. FIG. 7G depicts an example of the ripple in $V_{OUT}$ that follows an abrupt change in the load current. Note that FIG. 7G depicts an example in which circuits 104 and 106 are not used to provide a compensation current to the output of the voltage regulator 100.

FIGS. 6A-6F depict one embodiment of signals associated with the memory sense circuit 500 of FIG. 5. The following describes operation of the memory sense circuit 500 of FIG. 5 with respect to the various signals of FIGS. 6A-6F. Prior to a sense enable signal "SA_ENABLE" going high (FIG. 6C), the output of the voltage regulator $V_{OUT}$ is connected to the memory element 200 to bring the voltage across the memory element 200 up to $V_{OUT}$. Specifically, switch 520 closes to connect the output of the voltage regulator 100 to the anode of the diode 202. Note that the voltage regulator 100 will be coupled to numerous memory elements 200. For example, $V_{OUT}$ may be connected to hundreds of memory elements 200.

Figure 6:
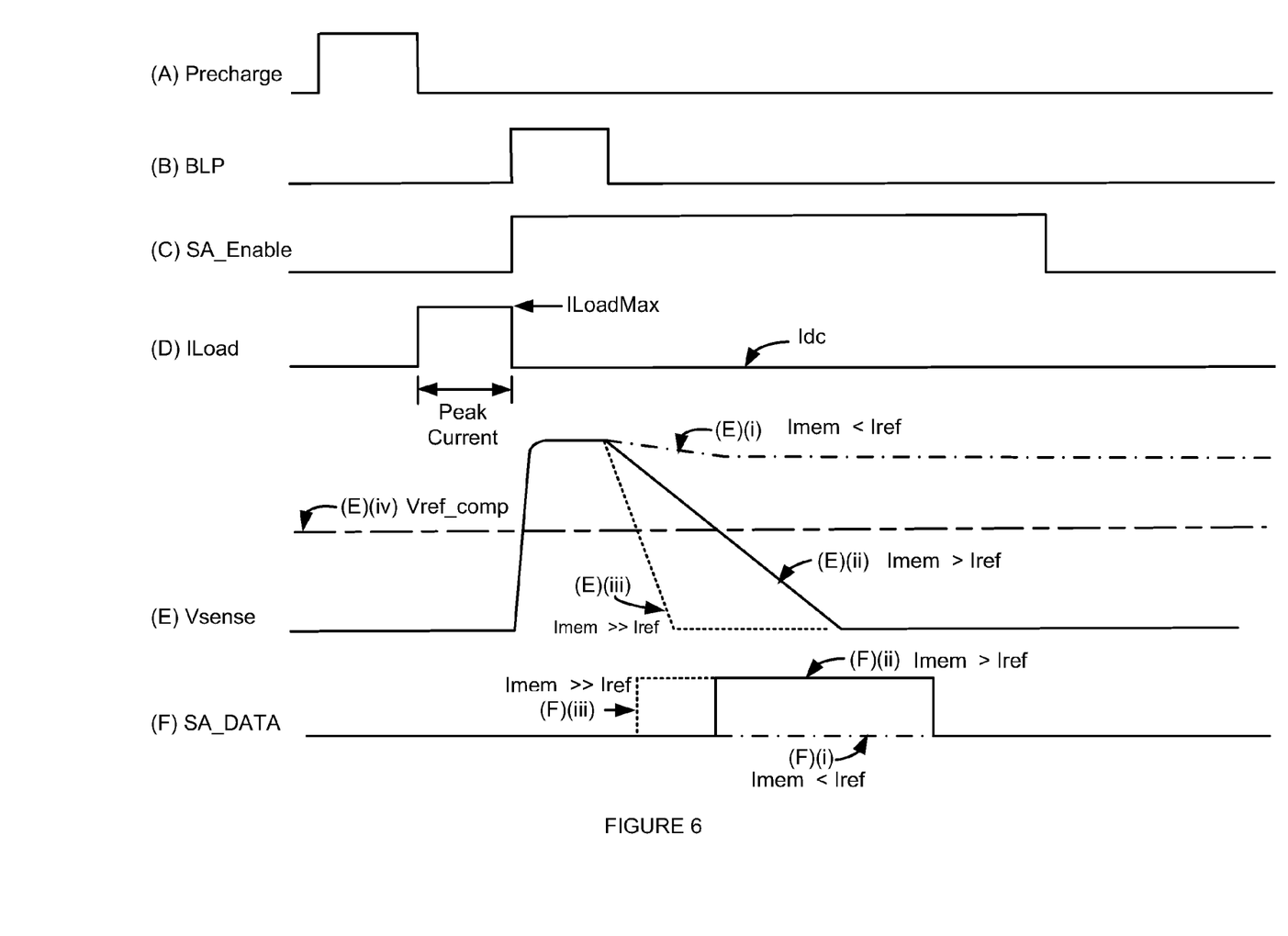

While SA_ENABLE is still low, a signal "precharge" goes high (FIG. 6A). This signal is used to supply a current to the voltage regulator 100 to assist in charging the memory elements 200. After the pre-charge signal goes low, there is a large change in the load current $I_{LOAD}$ of the voltage regulator 100. FIG. 6D depicts a DC value for the load current $I_{LOAD}$ and a maximum load current $I_{LOADMAX}$ that occurs just after the pre-charge signal goes low. The value "$I_{LOADMAX}$" is a maximum current that occurs during the period of time labeled in FIG. 6D as "peak current". The actual load current during the period may vary considerably between negative and positive peaks. Also note that the DC current represents an average current outside of the "peak current" interval. The actual DC current that is output by the voltage regulator 100 may vary somewhat over time.

After a peak current interval that follows the precharge signal going low, signals BLP (FIG. 6B) and SA_ENABLE (FIG. 6C) both go high. When BLP goes high, switch 524 closes and node A is precharged to a known voltage "VWR."

When SA_ENABLE goes high, switch 520 opens such that the direct output of the voltage regulator 100 is no longer connected to the memory cell 200. However, when SA_ENABLE goes high, amplifier 526 charges the memory element 200 to $V_{OUT}$. Specifically, amplifier 526 receives $V_{OUT}$ at the non-inverting input. The inverting input is coupled to the source of transistor 528. The output of amplifier 526 is the voltage SFGATE, which is provided to the gate of transistors 528 and 530. Transistor 530 provides a current to bias the memory element 200 to $V_{OUT}$.

After BLP goes to 0, the voltage at node A starts to decrease based on the state of the memory element 200 being sensed. That is, the (parasitic) capacitance $C_{PSENSE}$ at node A is discharged. FIG. 6E(i)-6(E)(iii) depicts several example cases that depict the discharge of $C_{PSENSE}$ based on the relative magnitude of the memory element current Imem to the reference current $I_{REF}$ generated by the current mirror. FIG. 6(E)(iv) depicts the reference voltage $V_{REF\_COMP}$ at the non-inverting input of the sense amplifier 504. FIG. 6(F) depicts the output of the sense amplifier 504, which depends on the relationship of the reference voltage $V_{REF}$ to the voltage of $V_{SENSE}$ at node A.

Referring to FIG. 6(E)(i), if $I_{MEM}$ is less than $I_{REF}$, then $V_{SENSE}$ drops very slowly. $V_{SENSE}$ will not drop sufficiently to cause the output (SA_DATA) of the sense amplifier 504 to switch. Thus, referring to FIG. 6(F)(i), SA_DATA remains low.

Referring to FIG. 6(E)(ii), if $I_{MEM}$ is somewhat less than $I_{REF}$, then $V_{SENSE}$ drops at a rate that depends on how much greater $I_{MEM}$ is than $I_{REF}$. When $V_{SENSE}$ drops below $V_{REF\_COMP}$, the output of the sense amplifier 504 switches. Referring to FIG. 6(F)(ii), SA_DATA goes from low to high when the voltage level depicted in FIG. 6(E)(ii) crosses the voltage level depicted in FIG. 6(E)(iv).

Referring to FIG. 6(E)(iii), if $I_{MEM}$ is substantially greater than $I_{REF}$, then $V_{SENSE}$ drops rapidly. When $V_{SENSE}$ drops below $V_{REF\_COMP}$, the output of the sense amplifier 504 switches (FIG. 6(F)(iii)). That is, SA_DATA goes from low to high.

The memory sense circuit 500 of FIG. 5, depicts two parasitic elements, $C_{PSELB}$ and $C_{PSENSE}$. These parasitic elements represent the coupling of conductive (e.g., metal) lines to other elements in the circuit. Specifically, $C_{PSELB}$ represents a parasitic capacitance of a conductive line between the memory element 200 and the output of the voltage regulator 100. As already discussed, $C_{PSENSE}$ represents a parasitic capacitance of a conductive line between the inverting input of the sense amplifier 504 and transistor 530. The values of these parasitic elements $C_{PSENSE}$ and $C_{PSELB}$ impact the correct detection of the state of the memory element 200. For example, $C_{PSENSE}$ affects the slope of $V_{SENSE}$ after BLP returns to 0. Further, $C_{PSELB}$ may be responsible for extra current due to variations of $V_{OUT}$.

FIGS. 7A-7G will be referred to in order to discuss a problem with maintaining the output voltage $V_{OUT}$ of the voltage regulator 100 under changing load conditions. FIGS. 7A-7G depict what would happen if the compensation current from the proportional current generation circuit 106 were not provided. Ideally, the output voltage $V_{OUT}$ of the voltage regulator 100 would be constant over time. However, the output voltage $V_{OUT}$ may tend to have some ripple as depicted in FIG. 7G if the compensation current from the proportional current generation circuit 106 were not provided. Note that there is a large change in voltage $V_{OUT}$ when the pre-charge signal (FIG. 7A) goes low. The memory elements are connected to the output of the voltage regulator 100 when the pre-charge signal goes low. Referring to FIG. 7G, this results in the voltage $V_{OUT}$ dropping significantly. After the initial drop, $V_{OUT}$ oscillates between overshooting and undershooting the target voltage in a decaying ripple. Thus, the decaying ripple is caused by the abrupt variation on the load current of voltage regulator 100 due to connecting the memory elements 200 to the voltage regulator 100.

It may take some time for the voltage ripple to settle down. The recovery period is depicted as the oscillation of $V_{OUT}$, which in this example occurs during the memory element sensing phase. That is, the oscillation of $V_{OUT}$ occurs when SA_ENABLE is high. Unfortunately, this oscillation interferes with the accurate sensing of the memory elements 200. For example, the voltage $V_{SENSE}$ may fall at a much more rapid rate than it should, which can prevent an accurate measurement.

If the voltage ripple extends beyond the point when BLP goes low (FIG. 7B), then the ripple could interfere with the sensing operation. Note that $V_{OUT}$ has some ripple that extends over and beyond the duration of BLP. This ripple negatively impacts the sensing of the memory element 200 for the following reason. The parasitic capacitance $C_{PSELB}$ contributes a current due to the ripple voltage. This capacitive current will be proportional to the size of the parasitic capacitance and the rate of change of $V_{OUT}$. This current adds to (or subtracts from) $I_{MEM}$. Furthermore, since $V_{OUT}$ is changing over time and the memory element current is a function of $V_{OUT}$, then the memory element current will fluctuate undesirably. Therefore, sensing of the memory element current while the ripple is present is unreliable. For example, even if $I_{MEM}$ is actually lower than $I_{REF}$, the combination of $I_{MEM}$ and the capacitive current could be greater then $I_{REF}$.

FIG. 7E depicts two cases for the rate of change of $V_{SENSE}$ after BLP goes low. One case is for an ideal output voltage from the voltage regulator 100, the other is for a real output voltage. By ideal output it is meant that the voltage regulator is not impacted by changes in the load, whereas a real output is impacted. Each case is for a memory element 200 for which $I_{MEM} < I_{REF}$. In the ideal case (7(E)(i)), $V_{SENSE}$ remains relatively high and the output of the sense amplifier 504 does not switch (7(F)(i)). However, in the real case, $V_{SENSE}$ drops rapidly (7(E)(ii)) such that the output of the sense amplifier 504 switches (7(F)(ii)) when $V_{SENSE}$ drops below $V_{REF}$. Unfortunately, this switching of the sense amplifier 504 causes an erroneous reading of the memory element 200.

One possible solution to this problem is to delay the sensing of the memory element 200 until after the ripple on $V_{OUT}$ settles down. For example, the period at which BLP is high might be extended to delay sensing the memory element current. However, this solution may not be desirable as it extends the amount of time needed to read the memory element 200.

Another possible solution is to add an amplifier that can absorb the extra current due to the load change. Specifically, an amplifier might provide a precharge current just prior to the signals BLP and SA_ENABLE going high. In other words, this solution would add a fast amplifier that is used to absorb all (or at least most) of the current needed to precharge the memory elements 200 before SA_ENABLE is set to 1. However, the voltage regulator 100 now has to provide the input voltage to the fast amplifier, along with its other duties. In this possible solution, $I_{LOAD}$ would not have an abrupt load current variation before SA_ENABLE. Thus, $V_{OUT}$ would remain at the target level. Therefore, the detection of $V_{SENSE}$ at node A would not be affected by the parasitic elements (e.g., $C_{PSELB}$).

A possible draw-back of this potential solution is the added amplifier circuit should be fast to be able to recover from the abrupt change to the load current and consequentially would sink substantial current from the power supply. Moreover, this additional amplifier might have a very low efficiency since it should be designed to be able to sink (or source) a very large current.

Figure 8:
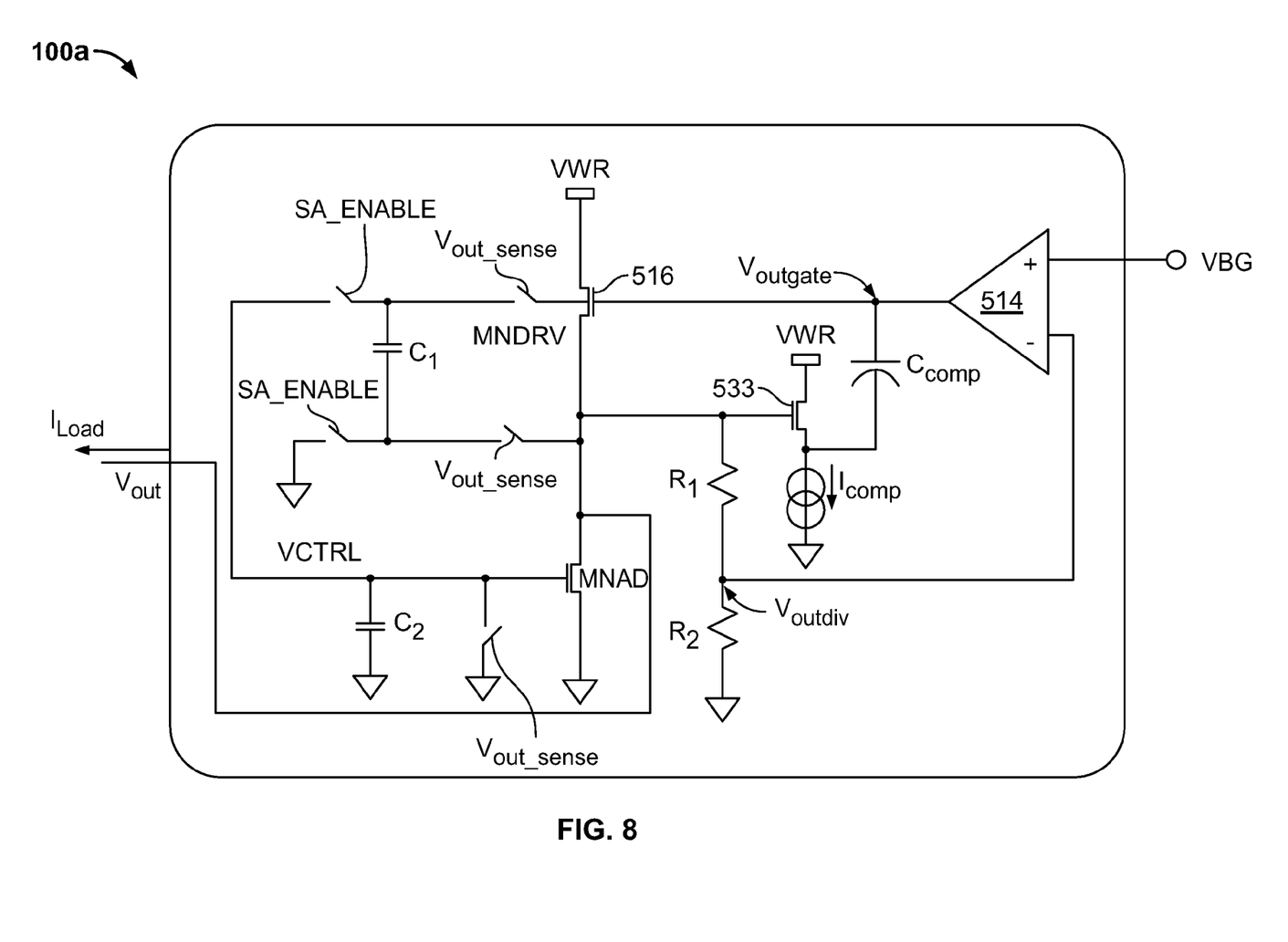
FIG. 8 depict one embodiment of a voltage regulator that uses linear capacitors.
Figure 10:
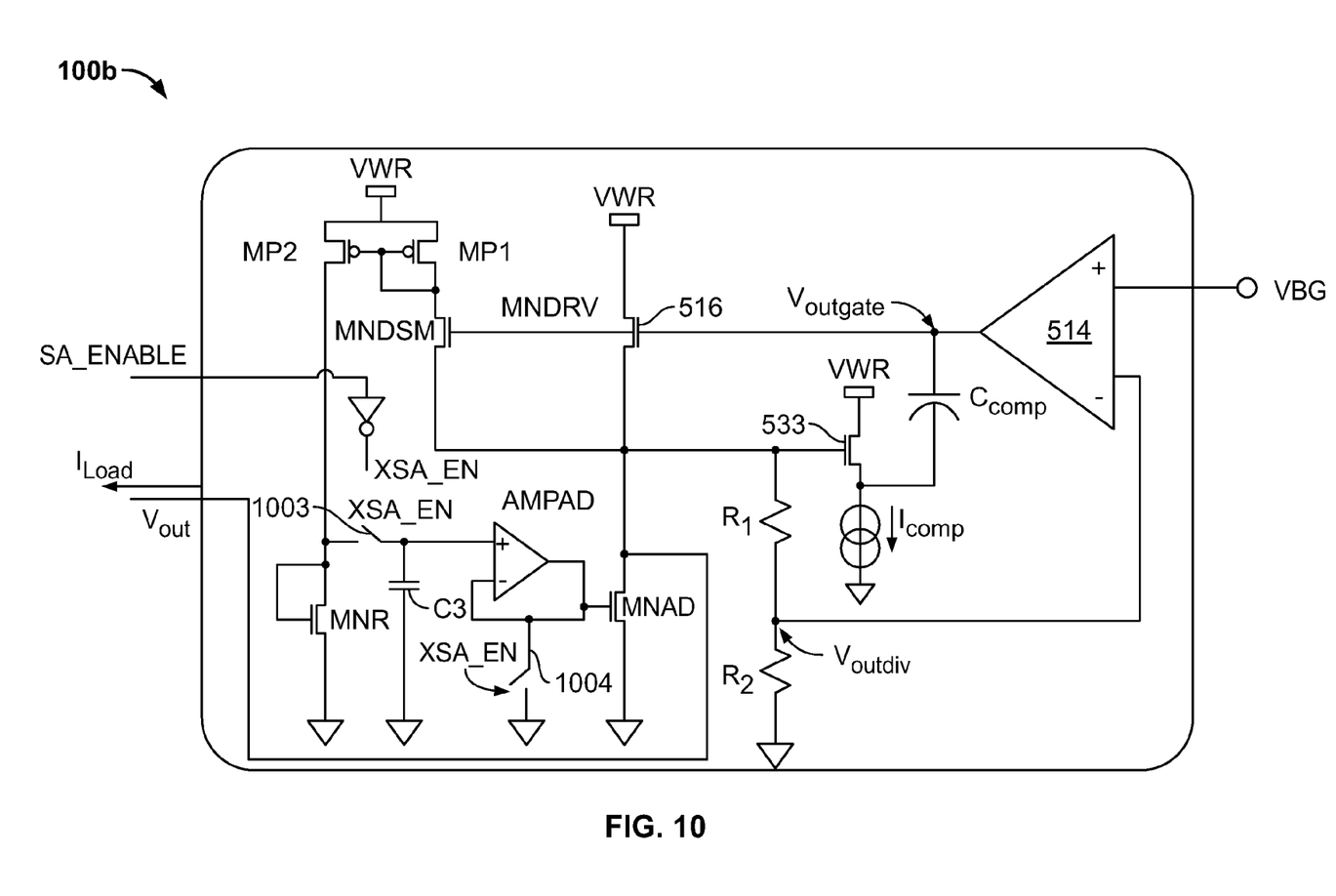
FIG. 10 depict one embodiment of a voltage regulator that uses a non-linear capacitor.

FIGS. 8 and 10 depict two different embodiments of voltage regulators that make use of different passive elements in order to provide a compensation current that is proportional to a maximum load current. The embodiment depicted in FIG. 8 uses linear capacitors. The capacitance of a linear capacitor is independent of the voltage applied to the capacitor plates. In one embodiment, metal-metal capacitors are used to implement the linear capacitors. However, because a metal-metal capacitor may require two separate metal layers (one for each plate), it may be desirable to have a solution that does not require a metal-metal capacitor. It is not required that that capacitor plates be formed from metal. In one embodiment, the plates of linear capacitors are formed from polysilicon. However, because two layers of polysilicon (one for each plate) are needed for a linear capacitor, it may be desirable to have a solution that does not need two layers of polysilicon. Note that using only a single polysilicon layer can save considerable expense. The embodiment depicted in FIG. 10 does not require the use of a linear capacitor. In other words, the capacitance may vary as a function of voltage.

Both implementations have circuits that sense a peak output of a voltage regulator 100 (e.g., a peak voltage regulator load current $I_{LOADMAX}$. The circuit of each embodiment adds a current that is proportional to $I_{LOADMAX}$. The proportional current is added during the memory element sensing phase (i.e., when SA_ENABLE=1). Note that it is not necessary for the compensation current to be as large as the peak current. It can be beneficial for the compensation current to be substantially less than the peak load current such that the additional circuits sink a very small current. Therefore, these solutions do not negatively impact the overall power efficiency of the voltage regulator 100.

The following is a description of the operation of voltage regulator 100a of FIG. 8. The timing diagrams of FIGS. 9A-9G will be referred to when discussing the operation of the voltage regulator 100a of FIG. 8. Capacitor $C_1$ is used to sense and store the gate to source voltage of driver transistor MNDRV, thereby sensing a signal that is related to the peak load current $I_{LOADMAX}$. A portion of the voltage stored by capacitor $C_1$ is transferred to capacitor $C_2$. The voltage that is transferred to capacitor $C_2$ will be referred to herein as $V_{CTRL}$. Transistor MNAD is used to provide a compensation current that is proportional to the peak load current $I_{LOADMAX}$. In this implementation, the voltage $V_{CTRL}$ that is applied to the gate of MNAD determines the magnitude of the compensation current.

Figure 9:
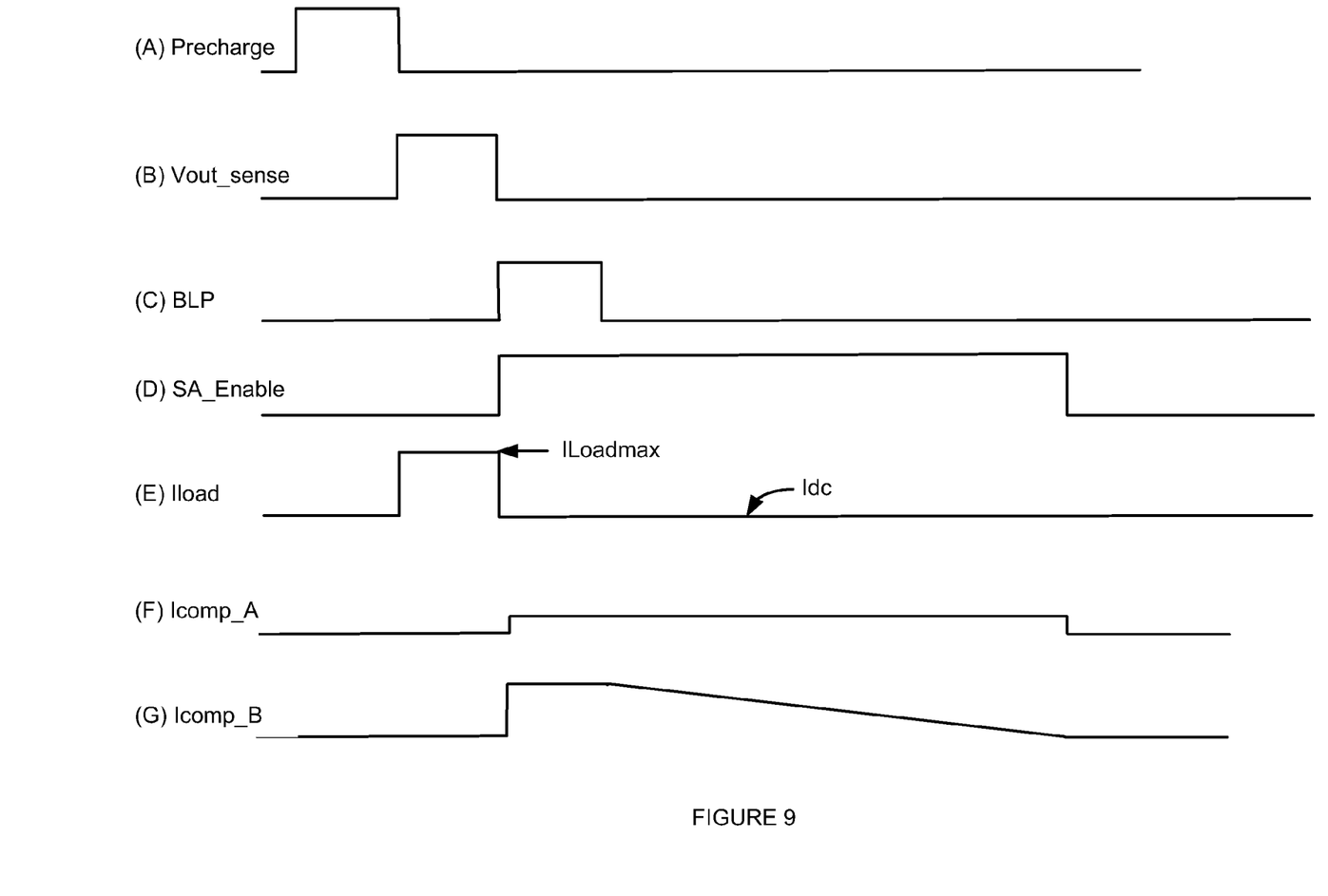

Operation of the voltage regulator 100a of FIG. 8 will now be discussed with reference to the timing diagram of FIG. 9. Voltage regulator 100a has five switches that are controlled by various signals in FIG. 9. One of these signals is $V_{OUT\_SENSE}$, which is used to trigger the sensing of the peak load current. Note that $V_{OUT\_SENSE}$ is high during the period that the load current is expected to be at its peak (FIG. 9E). When $V_{OUT\_SENSE}=1$, capacitor $C_1$ is connected between $V_{OUTGATE}$ and $V_{OUT}$ to sense a signal that is based on the peak load current. Specifically, capacitor $C_1$ stores the voltage, $(V_{OUTGATE} - V_{OUT})_{PEAK}$. That is, capacitor $C_1$ stores a voltage that is proportional to the difference between the output of amplifier 514 and $V_{OUT}$ (the output of the voltage regulator). This voltage will be referred to as $V_{MAX}$. Also note that this voltage represents the peak gate to source voltage of the driver transistor MNDRV 516.

During this sensing phase ($V_{OUT\_SENSE}$ is high), capacitor $C_2$ has both plates connected to ground. Further, the gate of transistor MNAND is connected to ground and is thus cut-off.

After sensing the peak load current, the voltage $V_{CTRL}$ is provided to the gate of transistor MNAD to generate a current that is proportional to the peak load current, as the following will illustrate. When SA_ENABLE goes high (FIG. 9D), the bottom plate of capacitor $C_1$ is grounded and the top plate of capacitor $C_1$ is connected to the top plate of capacitor $C_2$. Charge sharing between capacitors $C_1$ and $C_2$ determines the voltage that is transferred to capacitor $C_2$.

The following describes details of selecting circuit parameters to arrive at a desired proportionality of the compensation current to the peak load current. Some of the circuit parameters that can be varied include, but are not limited to, the sizes of capacitor $C_1$ and capacitor $C_2$, and the sizes/widths of transistors MNDRV and MNAD. In one embodiment, the ratio of $C_1/C_2$ and $(W/L)_{MNDRV}/(W/L)_{MNAD}$ determines the amount of current added to the output of the voltage regulator 100a to improve the settling time of the output voltage $V_{OUT}$.

For example, if $C_1=C_2$, then $V_{CTRL}=0.5*V_{MAX}$. Continuing this example, if transistors MNDRV and MNAD are identical, then the compensation current will be half the peak current. Note that it is not required to use capacitor $C_2$. In the case in which $C_2=0$, then $V_{CTRL}=V_{MAX}$.

The proportionality can be further tuned by selection of the widths and lengths of transistors MNDRV and MNAD. Note that the voltage that is being sensed by capacitor $C_1$ is the gate to source voltage of transistor MNDRV. Further note that the voltage $V_{CTRL}$ is applied between the gate and source of transistor MNAD. Thus, by appropriate selection of the ratio of $(W/L)_{MNDRV}/(W/L)_{MNAD}$ the proportionality of the current of MNAD to MNDRV can be achieved.

It may be desirable to have a linear relationship between $I_{LOADMAX}$ and the compensation current supplied by MNAD. In one implementation, to guarantee a linear relationship between $I_{LOADMAX}$ and the compensation current supplied by transistor MNAD, the capacitances of capacitors $C_1$ and $C_2$ should be independent of the voltages applied to their plates. In other words, the capacitors $C_1$ and $C_2$ are linear capacitors. Metal-metal capacitors can be fabricated such that the capacitance is independent of voltage. Hence, in one embodiment, capacitors $C_1$ and $C_2$ are metal-metal capacitors. Linear capacitors other than metal-metal capacitors might also be fabricated.

FIG. 9F depicts the relationship of one embodiment of the compensation current with respect to the various timing signals. The compensation current begins when SA_ENABLE goes high and ends when SA_ENABLE goes low again. However, the compensation current could start and end at other times. For example, the compensation current could start later, after some delay after SA_ENABLE goes high. Moreover, it may not be necessary to provide the compensation current all the way until SA_ENABLE goes low again.

In the option depicted in FIG. 9F, the compensation current is relatively constant over the period in which it is applied. However, this is not a requirement. FIG. 9G depicts one embodiment in which the compensation current decreases over time. In this embodiment, voltage $V_{CTRL}$ can be gradually reduced to cause the decrease in the compensation current. Note that because the ripple voltage decays over time, it may not be necessary for the compensation current to be as strong later in the sensing period.

FIG. 10 depicts a voltage regulator 100b that is similar to the circuit of FIG. 8. However, this voltage regulator 100b does not require capacitors whose capacitance is independent of voltage. Thus, it is not required that metal-metal capacitors be used. Because forming a metal-metal capacitor may require two separate metal layers, the voltage regulator 100b of FIG. 10 can be formed more simply than the embodiment of FIG. 8. However, overall the operation is very similar to the embodiment of FIG. 8.

Specifically, transistor MNDSM is a scaled down replica of driver transistor MNDRV 516. The scale factor will be referred to as "m" and in this example is much higher than 1. Therefore, the voltage regulator output current ($I_{LOAD}$) is supplied almost entirely by the driver transistor MNDRV. Note that the gate of these two transistors are coupled together and also the sources are coupled together. Therefore, the current in transistor MNDSM tracks that of the driver transistor MNDRV, but is much smaller due to its smaller scale. Transistor MNDSM is thus biased with the current $I_{LOAD}/m$.

Transistors MP1 and MP2 form a current mirror in order to mirror the current $I_{LOAD}/m$. Specifically, transistor MP1 is coupled to transistor MNDSM such that it is biased with a current that is a fraction "m" of the load current $I_{LOAD}$. Transistors MP1 and MP2 may be identical such that transistor MP2 provides the current $I_{LOAD}/m$ to transistor MNR. However, transistors MP1 and MP2 could be sized differently such that a current that is smaller or larger than current $I_{LOAD}/m$ is provided to transistor MNR.

Capacitor $C_3$ tracks the gate-source voltage of transistor MNR when SA_ENABLE is low. That is, switch 1003 is closed when SA_ENABLE is low. When SA_ENABLE is low, switch 1004 is closed to connect the gate of transistor MNAD to ground. Therefore, transistor MNAD is shut off when SA_ENABLE is low. FIG. 10 depicts the signal XSA_EN, which is the opposite of SA_ENABLE, being applied to switches 1003 and 1004.

When SA_ENABLE is high, capacitor $C_3$ is disconnected from transistor MNR. However, capacitor $C_3$ maintains the charge that was stored when SA_ENABLE was low. At this time, amplifier AMPAD buffers the voltage that is across capacitor $C_3$ and biases transistor MNAD, which delivers to the output of the voltage regulator 100b a current that is proportional to $I_{LOADMAX}$. Therefore, the voltage regulator 100b delivers a compensation current that is proportional to the maximum load current $I_{LOADMAX}$. Note that by appropriate selection of the ratio of $(W/L)_{MNDRV}/(W/L)_{MNAD}$ the relationship between the compensation current and the load current can be further tuned.

Note that capacitor $C_3$ is not required to be a linear capacitor $C_3$ in order to assure a linear relationship between the maximum load current and the compensation current. Thus, capacitor $C_3$ is not required to be a metal-metal capacitor. Therefore, capacitor $C_3$ can easily be fabricated. A reason why capacitor $C_3$ is not required to be a linear capacitor is that a single capacitor $C_3$ both stores the signal that is based and the peak load current and supplies that stored signal to transistor MNAD. Thus, even if the capacitance of capacitor $C_3$ depends on the voltage across its plates, a linear relationship between the peak load current and the compensation current provided by transistor MNAD is maintained.

While example embodiments of using a voltage regulator within a memory array have been provided, the present invention is not limited to use in a memory array. Moreover, while examples in which the memory elements are state change elements have been provided, a voltage regulator in accordance with embodiments of the present invention may be used with memory arrays have other types of memory elements. An example of a different type of memory array is a NAND memory array. Relevant examples of NAND type memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND, as well as other types of non-volatile memory.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A voltage regulation circuit comprising:
a voltage generation circuit that outputs a regulated voltage and a load current;
a sensing circuit that is in communication with the voltage generation circuit and senses a peak magnitude of the load current, the sensing circuit stores a peak signal that is based on the peak magnitude of the load current;
an input that receives at least one signal; and
a current generation circuit that is in communication with the voltage generation circuit and the sensing circuit, the current generation circuit generates a compensation current that has a magnitude that is proportional to the peak magnitude of the load current, the current generation circuit generates the compensation current based on the peak signal, the current generation circuit generates the compensation current during a time interval that is defined by the at least one signal.

2. A voltage regulation circuit as recited in claim 1, wherein the time interval is a first time interval and the sensing circuit senses the peak magnitude of the load current during a second time interval that is defined by the at least one signal.

3. A voltage regulation circuit as recited in claim 1, wherein the voltage generation circuit provides the regulated voltage to non-volatile storage elements in a memory array, and the at least one signal that is input to the voltage regulation circuit is based on one or more timing signals that are used when sensing conditions of the non-volatile storage elements.

4. A voltage regulation circuit as recited in claim 3, wherein the time interval coincides with a time in which a condition of at least one non-volatile storage element of the non-volatile storage elements is being sensed.

5. A voltage regulation circuit as recited in claim 4, wherein the voltage regulation circuit pre-charges the at least one non-volatile storage element in preparation of sensing the condition of the at least one of non-volatile storage element, the peak magnitude of the load current occurs as a result of the pre-charging.

6. A voltage regulation circuit as recited in claim 1, wherein the voltage generation circuit comprises a driver transistor, the driver transistor has a gate and source;
the sensing circuit comprises:
a signal storage element; and
one or more switches that couple the signal storage element between the gate and the source of the driver transistor in response to a first signal of the at least one signal that is input to the voltage regulation circuit, the signal storage element stores a peak voltage that occurs between the gate and the source during the time in which the first signal is active, the peak voltage is the peak signal.

7. A voltage regulation circuit as recited in claim 6, wherein the one or more switches are one or more first switches, wherein the current generation circuit comprises:
a compensation transistor that provides the compensation current, the compensation transistor is shut off when the first signal is active; and
one or more second switches, the one or more second switches couple at least a portion of the peak signal from the signal storage element to the compensation transistor in response to a second signal of the at least one signal that is input to the voltage regulation circuit.

8. A voltage regulation circuit as recited in claim 7, wherein the signal storage element is a first linear capacitor, the current generation circuit has a second linear capacitor, the one or more second switches couple the first linear capacitor and the second linear capacitor in parallel when the second signal is active, the one or more second switches de-couple the second linear capacitor from the first linear capacitor when the second signal is inactive.

9. A voltage regulation circuit as recited in claim 1, wherein the sensing circuit comprises:
a first transistor that senses a first voltage that is based on a magnitude of the load current;
a signal storage element;
a circuit that produces a second voltage that is proportional to the first voltage, the second voltage is produced at a node; and
one or more switches that couple the signal storage element to the node when a first of the at least one signal that is input to the voltage regulation circuit is active, the signal storage element stores a peak voltage based on a magnitude of the first voltage during the time in which the first signal is active.

10. A voltage regulation circuit as recited in claim 9, wherein the current generation circuit comprises:
a second transistor that provides the compensation current, the signal storage element is coupled to the second transistor when the first signal is inactive, a signal that is derived from the peak voltage that is stored on the signal storage element is provided to the second transistor.

11. A memory array comprising:
a plurality of non-volatile storage elements;
a plurality of sense amplifiers, the sense amplifiers sense conditions of the non-volatile storage elements; and
a voltage regulation circuit that comprises:
a voltage generation circuit that outputs a regulated voltage, the voltage regulation circuit establishes the regulated voltage at the non-volatile storage elements prior to the sense amplifiers sensing conditions of the non-volatile storage elements, the voltage generation circuit has a load current when establishing the regulated voltage at the non-volatile storage elements;
a sensing circuit that is in communication with the voltage generation circuit and senses a peak magnitude of the load current that results from the voltage generation circuit establishing the regulated voltage at the non-volatile storage elements, the sensing circuit stores a peak signal that is based on the peak magnitude of the load current; and
a current generation circuit that is in communication with the voltage generation circuit and with the sensing circuit, the current generation circuit generates a compensation current that is proportional to the peak magnitude of the load current, the current generation circuit generates the compensation current based on the peak signal, the current generation circuit generates the compensation current during at least a portion of an interval in which the sense amplifiers sense conditions of the non-volatile storage elements.

12. A memory array as recited in claim 11, wherein the voltage generation circuit comprises a driver transistor, the driver transistor has a gate and a source;
the sensing circuit comprises:
a capacitor; and
one or more switches that couple the capacitor between the gate and the source of the driver transistor during at least a portion of the interval in which the voltage generation circuit establishes the regulated voltage at the non-volatile storage elements, the capacitor stores a peak voltage that occurs between the gate and the source, the peak voltage is the peak signal.

13. A memory array as recited in claim 12, wherein the capacitor in the sensing circuit is a first capacitor, and wherein the current generation circuit comprises:
a compensation transistor that provides the compensation current, the compensation transistor is shut off at least during the time in which the voltage generation circuit establishes the regulated voltage at the non-volatile storage elements; and
one or more second switches, the one or more second switches couple at least a portion of the peak signal from the capacitor to the compensation transistor during at least a portion of the interval in which the sense amplifiers sense conditions of the non-volatile storage elements.

14. A memory array as recited in claim 13, wherein the capacitor is a first metal capacitor, the current generation circuit has a second metal capacitor, the one or more second switches couple the first capacitor and the second capacitor in parallel during at least a portion of the interval in which the sense amplifiers sense conditions of the non-volatile storage elements, the one or more second switches de-couple the second capacitor from the first capacitor at least during the time in which the voltage generation circuit establishes the regulated voltage at the non-volatile storage elements.

15. A memory array as recited in claim 11, wherein the sensing circuit comprises:
a first transistor that senses a first voltage that is based on a magnitude of the load current;
a capacitor;
a circuit that produces a second voltage that is proportional to the first voltage, the second voltage is produced at a node; and
one or more switches that couple the capacitor to the node during at least a portion of the interval in which the voltage generation circuit establishes the regulated voltage at the non-volatile storage elements, the capacitor stores a peak voltage based on a magnitude of the first voltage.

16. A memory array as recited in claim 15, wherein the current generation circuit comprises:
a second transistor that provides the compensation current, the capacitor is coupled to the second transistor during at least a portion of the interval in which the sense amplifiers sense conditions of the non-volatile storage elements, a signal that is derived from the peak voltage that is stored on the capacitor is provided to the second transistor.

17. A memory array as recited in claim 16, wherein the second transistor is shut off when the voltage generation circuit establishes the regulated voltage at the non-volatile storage elements.

18. A method comprising:
generating a regulated voltage at an output node, the output node having a load current associated therewith;
applying the regulated voltage to non-volatile storage elements in a memory array;
sensing a peak magnitude of the load current, the sensing is in response to at least one signal that is derived from timing signals that are used when reading the non-volatile storage elements;
generating a compensation current that is proportional to the peak magnitude of the load current;
determining a condition associated with at least a first non-volatile storage element of the non-volatile storage elements; and
providing the compensation current to the output node, the providing is performed while determining the condition.

19. A method as recited in claim 18, wherein the sensing a peak magnitude of the load current includes storing a signal that is based on the peak magnitude of the load current.

20. A method as recited in claim 19, wherein the generating a compensation current includes providing a signal to a compensation current element, the signal is based on the stored signal.

21. A method as recited in claim 18, wherein the sensing a peak magnitude of the load current includes storing a peak voltage of a driver transistor that provides the load current.

* * * * *